(12) United States Patent
Nagulapalli

(10) Patent No.: US 12,267,043 B2
(45) Date of Patent: Apr. 1, 2025

(54) CLOCK JITTER FILTER

(71) Applicant: Analog Devices International Unlimited Company, Limerick (IE)

(72) Inventor: Rajasekhar Nagulapalli, Northampton (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/128,699

(22) Filed: Mar. 30, 2023

(65) Prior Publication Data

US 2024/0333213 A1    Oct. 3, 2024

(51) Int. Cl.
*H03B 5/08* (2006.01)
*H03K 5/00* (2006.01)
*H03K 5/01* (2006.01)

(52) U.S. Cl.
CPC ............... *H03B 5/08* (2013.01); *H03K 5/01* (2013.01); *H03B 2200/0088* (2013.01); *H03K 2005/00078* (2013.01)

(58) Field of Classification Search
CPC .... H03B 5/08; H03B 2200/0088; H03K 5/01; H03K 2005/00078

USPC .... 327/161, 147, 158, 172; 331/1 A, 34, 57, 331/176, 1 R
See application file for complete search history.

(56) References Cited

U.S. PATENT DOCUMENTS 10,148,261 B1 *  12/2018  Jagannathan ....... H04L 25/0286
2008/0079458 A1 *   4/2008  Shin ................. H03K 19/00384
                                                        326/30

* cited by examiner

*Primary Examiner* — Arnold M Kinkead
(74) *Attorney, Agent, or Firm* — Schwegman Lundberg & Woessner, P.A.

(57) ABSTRACT

A system for reducing clock jitter may include first jitter reducing circuitry. The first jitter reducing circuitry may be arranged between an input clock signal node carrying an input clock signal and an output clock signal node carrying an output clock signal. The first jitter reducing circuitry may include a first intermediate input clock signal node and a first intermediate output clock signal node. The first jitter reducing circuitry may include a first clock delay circuit, which may be configured to: (1) delay a first intermediate input clock signal received on the first intermediate input clock signal node by an odd integer multiple of one half of a period, and (2) invert the first intermediate input clock signal. The first jitter reducing circuitry may also include a first connection, which may be from the first intermediate output clock signal node to the first intermediate input clock signal node.

20 Claims, 8 Drawing Sheets

US 12,267,043 B2

CLOCK JITTER FILTER

TECHNOLOGICAL FIELD

The present disclosure relates to electronics, and more particularly, but not by way of limitation, to a clock jitter filter that can be used to help reduce the jitter in a clock signal.

BACKGROUND

Electronic systems can use a clock signal to synchronize the operations of digital circuits. For example, a clock signal can oscillate between low and high binary signal values at a specified frequency and with approximately a 50 percent duty cycle. The digital circuits using the clock signal for synchronization may operate using the rising edge or using the falling edge of the clock signal. The frequency of the clock signal may be selected to maximize data throughput while allowing the digital circuits sufficient time to operate.

SUMMARY

A clock signal may include a level of clock jitter. Clock jitter may be an uncertainty in the position of one or more of a rising edge or a falling edge of a clock signal. For example, a clock signal may have a period that is generally consistent over time, such as on average. However, specific cycles of the clock signal may be longer or shorter than the average period. For example, a specific half cycle logical high signal may be shorter than the average half cycle. A circuit may be configured so that a specified number of circuit operations can be performed in each clock cycle. The number of operations may be determined based on a minimum time to complete the operations. Clock jitter may be accounted for by using a worst case scenario for clock jitter. A worst case scenario length of a clock cycle may be shorter than the average clock cycle. This may result in reducing the number of operations performed per clock cycle so that all operations can be performed in the worst case scenario. However, if clock jitter were removed or reduced, more operations may be able to be performed, or a frequency of the circuit may be able to be increased, or both.

Certain types of clocks may have a larger level of clock jitter. For example, ring oscillators may have more clock jitter than LC oscillators. Ring oscillators may be desirable for lower cost, space savings, or both. However, the level of clock jitter in a ring oscillator may result in the circuit running slower.

The present inventors have recognized, among other things, that reducing clock jitter may help allow circuits to operate more quickly, allow circuits to operate more efficiently, allow for the use of less expensive oscillators, or allow for the use of smaller oscillators.

Clock signal chains may also contribute to clock jitter, such as when the clock signal passes through one or more buffers. It may be desirable to reduce the clock jitter caused by clock signal chains, such as alternatively or in addition to reducing the jitter caused by oscillators. The present inventors have recognized, among other things, that a circuit may include one or more inverting buffers in a clock signal chain, such as may help improve the integrity of the clock signal. The clock jitter filter of the present disclosure may include one or more of these inverting buffers.

In an example a system for reducing clock jitter may include first jitter reducing circuitry. The first jitter reducing circuitry may be arranged between an input clock signal node carrying an input clock signal and an output clock signal node carrying an output clock signal. The first jitter reducing circuitry may include a first intermediate input clock signal node and a first intermediate output clock signal node. The first jitter reducing circuitry may include a first clock delay circuit, which may be configured to: (1) delay a first intermediate input clock signal received on the first intermediate input clock signal node by an odd integer multiple of one half of a period, and (2) invert the first intermediate input clock signal. The first jitter reducing circuitry may also include a first connection, which may be from the first intermediate output clock signal node to the first intermediate input clock signal node.

In an example, a method for managing clock jitter may include delaying an input clock signal on an input clock signal node by an odd integer multiple of one half of a period between the input clock signal node and an output clock signal node. The method may also include inverting the input clock signal between the input clock signal node and the output clock signal node. The method may also include providing a signal representative of the output clock signal to the input clock signal node.

In an example, a system for reducing clock jitter may include first jitter reducing circuitry. The first jitter reducing circuitry may be arranged between an input clock signal node carrying an input clock signal and an output clock signal node carrying an output clock signal. The first jitter reducing circuitry may include a first intermediate input clock signal node and a first intermediate output clock signal node. The first jitter reducing circuitry may include a first clock delay circuit including (1) means to delay a first intermediate input clock signal received on the first intermediate input clock signal node by an odd integer multiple of one half of a period, and (2) means to invert the first intermediate input clock signal. The first jitter reducing circuitry may also include a first connection, which may include means to provide a signal from the first intermediate output clock signal node to the first intermediate input clock signal node.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

DETAILED DESCRIPTION

Figure 1:
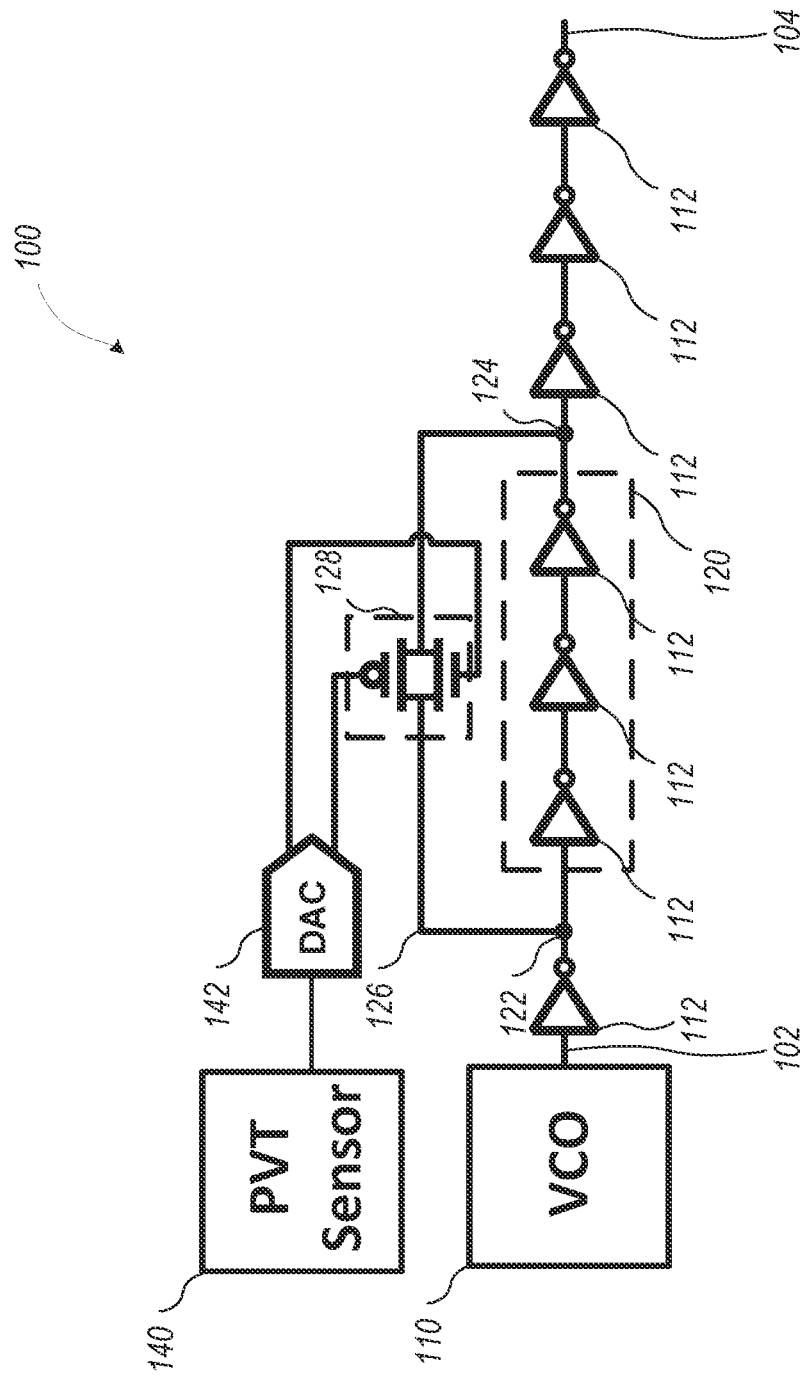
FIG. 1 is a schematic drawing of an example of portions of a clock jitter filter and portions of an environment in which the clock jitter filter may be used.

FIG. 1 is a schematic drawing of an example of portions of a clock jitter filter 100 and portions of an environment in which the clock jitter filter may be used. FIG. 1 shows that the clock jitter filter 100 may include an input clock signal node 102, an output clock signal node 104, a first intermediate input clock signal node 122, a first intermediate output clock signal node 124, a first clock delay circuit 120, and a first connection 126. The clock jitter filter 100 may be connected to a clock generator 110.

The input clock signal node 102 may receive an input clock signal. For example, the input clock signal node 102 may receive an input clock signal from the clock generator 110. The clock generator 110 may generate a clock signal with a substantially constant frequency, or the clock generator 110 may be capable of generating a range of clock frequencies. The clock generator 110 may be a voltage controlled oscillator (VCO) which may generate a clock signal of a specified frequency based upon a specified voltage input. For example, it may be desirable to tune or adjust the frequency of a clock signal to one or more of maximize data throughput, minimize energy consumption, or match a frequency of an other system. In an example, the clock generator 110 may include one or more of a voltage controlled LC oscillator or a voltage controlled ring oscillator. The clock signal received on the input clock signal node 102 may have a duty cycle that is 50 percent or near 50 percent. For example, the clock signal may spend approximately the same amount of time in the logical high binary state as the logical low binary state. The clock generator 110 may produce a clock signal with a level of clock jitter, such as may be due to one or more of the design of the circuit, an imprecision in the manufactured circuit, or electrical noise.

The first intermediate input clock signal node 122 may receive a representation of the clock signal input to the input clock signal node 102 as the clock signal propagates through a clock signal chain. For example, the first intermediate input clock signal node 122 may be separated from the input clock signal node 102 by one or more buffers or other circuit components, such as may include an inverting buffer 112. In an example, the input clock signal node 102 and the first intermediate input clock signal node 122 may comprise the same node. For example, the input clock signal node 102 and the first intermediate input clock signal node 122 may not be required to be separated by an inverting buffer 112 or other circuitry.

The inverting buffer 112 may one or more of sharpen a rising edge of a clock signal, sharpen a falling edge of a clock signal, or increase an available clock power. The inverting buffer 112 may also invert the clock signal, such as may include outputting a logical high value when a logical low value is input and outputting a logical low value when a logical high value is input. The inverting buffer 112 may include circuitry to detect a rising edge and sharpen it, as opposed to maintaining a rounded shape of a rising edge. The inverting buffer 112 may include circuitry to detect a falling edge and sharpen it, as opposed to maintaining a rounded shape of a falling edge. A series of one or more inverting buffers 112 in a clock signal chain may be used to one or more of transmit a clock signal over specified distance or provide a clock signal to a specified number of circuits. The inverting buffer 112 may increase a level of clock jitter, such as may be due to one or more of the design of the circuit, an imprecision in the manufactured circuit, or electrical noise.

The output clock signal node 104 may carry a representation of the input clock signal input to the input clock signal node 102. For example, the output clock signal node 104 may be connected to the input clock signal node 102 by one or more inverting buffers 112 in a cascaded arrangement. The output clock signal node 104 may be used to feed one or more circuits. Various circuit nodes between the input clock signal node 102 and the output clock signal node 104 may be used to feed one or more circuits. For example, there may be a plurality of circuits receiving a clock signal from one or more points along the clock signal chain between the input clock signal node 102 and the output clock signal node 104. Alternatively or in addition, the clock signal chain may serve to carry the input clock signal across a distance, such as may include across one or more of a portion of an integrated circuit or a portion of a printed circuit. The one or more inverting buffers 112 may help to maintain the input clock signal as it is carried.

The first intermediate output clock signal node 124 may receive a representation of the clock signal input to the first intermediate input clock signal node 122. For example, the first intermediate output clock signal node 124 may be separated from the first intermediate input clock signal node 122 by the first clock delay circuit 120, such as may include one or more inverting buffers 112. The output clock signal node 104 may receive a representation of the clock signal on the first intermediate output clock signal node 124. In an example, the first intermediate output clock signal node 124 and the output clock signal node 104 may comprise the same node. For example, the first intermediate output clock signal node 124 and the output clock signal node 104 may not be required to be separated by an inverting buffer 112 or other circuitry.

The first clock delay circuit 120 may include one or more inverting buffers 112. The first clock delay circuit 120 may be coupled between the first intermediate input clock signal node 122 and the first intermediate output clock signal node 124 along the clock signal chain. The first clock delay circuit 120 may delay a clock signal by an odd integer multiple of one half of a period between the first intermediate input clock signal node 122 an the first intermediate output clock signal node 124, such as may include one-half of a period, three-halfs of a period, five-halfs of a period, seven-halfs of a period, or nine-halfs of a period. The first clock delay circuit 120 may invert the clock signal between the first intermediate input clock signal node 122 and the first intermediate output clock signal node 124. For example, the first clock delay circuit 120 may include an odd number of inverting buffers 112 in a cascaded arrangement. In an example, the inverting buffers 112 may provide both the odd integer multiple of one half period delay and the inversion. In an example, the first clock delay circuit 120 may include one inverting buffer, 3 cascaded inverting buffers, 5 cascaded inverting buffers, 7 cascaded inverting buffers, or 9 cascaded inverting buffers.

In an example, a delay of the first clock delay circuit 120 may be one or more of tuned or adjusted, such as may include tuning or adjusting the delay towards an odd integer multiple of half a period. In an example, a delay of the first clock delay circuit 120 may be tuned or adjusted to respond to an intentional adjusting of the input clock frequency on the input clock signal node 102. In an example, a delay of the first clock delay circuit 120 may be tuned or adjusted in response to a variation in one or more of temperature, voltage, or manufacturing variation.

The first connection 126 may provide a connection between the first intermediate input clock signal node 122 and the first intermediate output clock signal node 124. The first connection 126 may one or more of provide a representation of the signal on the first intermediate input clock signal node 122 to the first intermediate output clock signal node 124, or provide a representation of a signal on the first intermediate output clock signal node 124 to the first intermediate input clock signal node 122. For example, the first connection 126 may provide a feed forward connection along the clock signal chain, a feedback connection along the clock signal chain, or both. The first connection 126 may provide a first specified impedance value. For example, the first connection 126 may include an impedance element 128, such as may include one or more of passive circuit elements or active circuit elements. In an example, the impedance element 128 may not be required to be included and an impedance of the first connection 126 may be provided only by the first connection 126, such as may include an impedance of an electrical connection between the first intermediate input clock signal node 122 and the first intermediate output clock signal node 124. The first connection 126 may include one or more of a wire, electrically conductive trace, conductively doped semiconductor pathway, or the like.

The impedance element 128 may include a transmission gate, such as may provide a variable impedance that may be substantially consistent in both the feed forward and feedback directions. In an example, the impedance element 128 may include a single transistor, such as may provide an impedance that may be substantially different in one direction than the other direction. For example, a single transistor may favor a feed forward signal over a feedback signal, or vice versa. The impedance element 128 may have a hard-wired bias feed, such as may result in a substantially constant impedance. The impedance element 128 may have a variable impedance, such as may include an impedance that can be adjusted by a control input. The impedance element 128 may be connected to a digital-to-analog converter (DAC) 142. The DAC 142 may generate one or more analog output voltage levels based upon a digital input received by the DAC 142. The one or more analog output voltage levels may be coupled to the impedance element 128, such as may adjust an impedance of the impedance element 128. In an example, two analog output voltage levels may be coupled to respective terminals of an NMOS transistor and a PMOS transistor of a transmission gate within the impedance element 128. In an example, the impedance element 128 may include a passive element, such as may include one or more of one or more resistors, one or more capacitors, or one or more inductors.

The DAC 142 may receive the digital input signal from a process voltage and temperature (PVT) sensor 140. The PVT sensor 140 may generate the digital signal to adjust an impedance or other property of the impedance element 128, such as may adjust a performance of the clock jitter filter 100. In an example, the PVT sensor 140 may adjust the property of the impedance element 128 based upon one or more of a process variation, voltage variation, or temperature variation, such as may comprise PVT corners of a circuit. The PVT sensor 140 may adjust an impedance of the impedance element 128 to compensate for PVT corners. For example, the PVT sensor 140 may increase an impedance of the impedance element 128 when the temperature decreases. In an example, the PVT sensor 140 may adjust an analog voltage to the impedance element 128 to maintain an impedance of the impedance element 128 as a temperature decreases.

A process variation may include a variation in the manufacturing or assembly of a circuit or chip. A voltage variation may include a variation in the operating voltage of a circuit or chip, such as may be due to one or more of a variation in a received input voltage or a variation in current resulting in changing voltage drop. A variation in temperature may include a variation in the operating temperature, such as may be due to one or more of the surrounding temperature or the energy dissipation of a circuit or chip. The process variation, voltage variation, temperature variation, and other like parameters, may be considered separately or in composite. For example, a decrease in voltage may counteract an increase in temperature, or a decrease in voltage may increase an effect due to an increase in temperature.

In an example, the PVT sensor 140 may adjust an impedance of the impedance element 128 to tune a performance of the clock jitter filter 100 in response to a measured value of the clock jitter filter 100. For example, a measure of clock jitter may be determined, and an impedance of the impedance element 128 may be adjusted, such as to one or more of find a minimum clock jitter value or reduce a clock jitter towards a goal jitter value. This may occur alternatively or in addition to adjusting the impedance element 128 based upon PVT corners.

The clock jitter filter 100 of FIG. 1 may result in the clock signal at one or more of the first intermediate output clock signal node 124 or the output clock signal node 104 having reduced jitter as compared to the clock signal at one or more of the input clock signal node 102 or the first intermediate input clock signal node 122.

Figure 2:
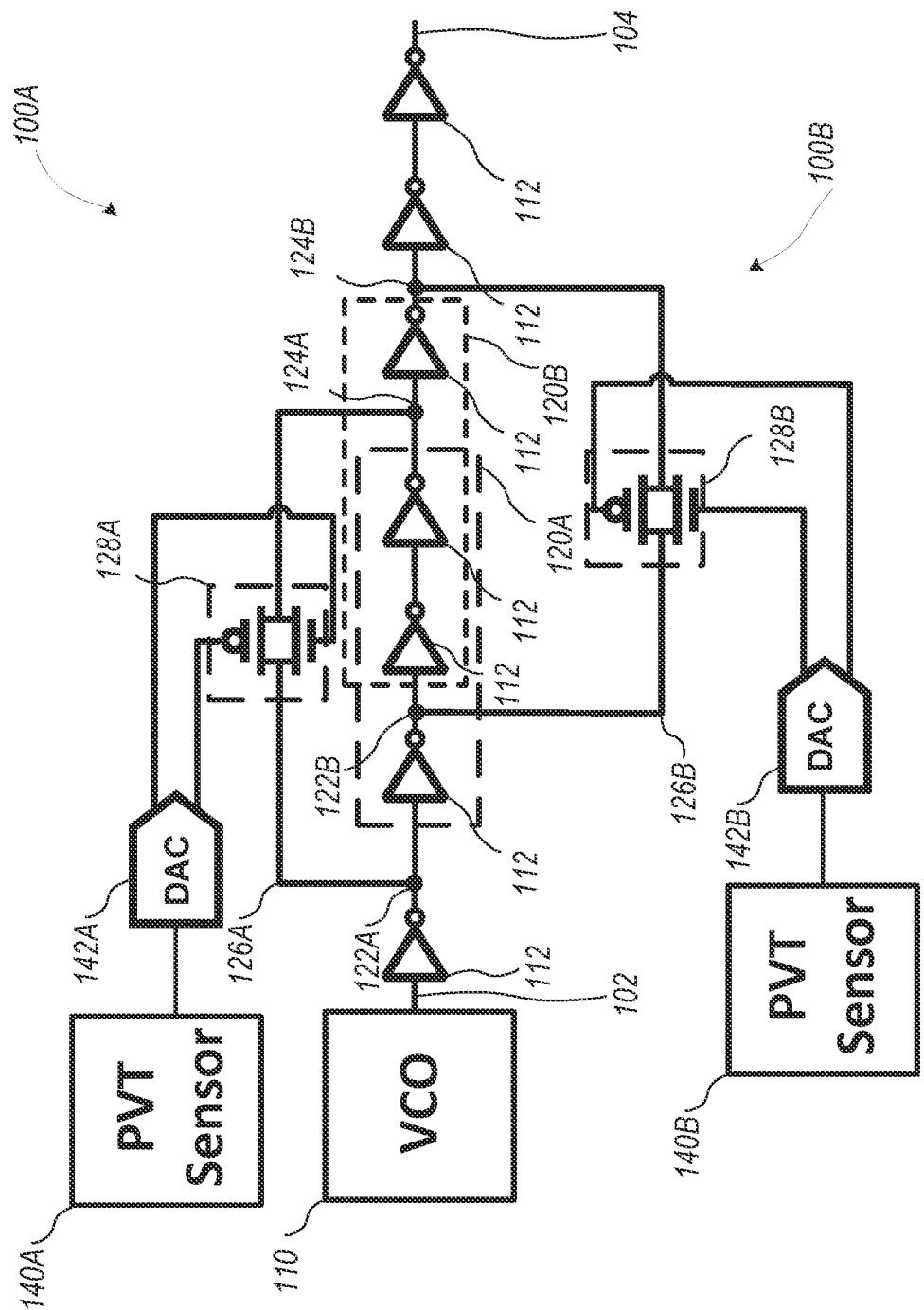
FIG. 2 is a schematic drawing of an example of portions of circuit including two clock jitter filters and portions of an environment in which the clock jitter filters may be used.

FIG. 2 is a schematic drawing of an example of portions of a circuit including two clock jitter filters (100A and 100B) and portions of an environment in which the clock jitter filters may be used. FIG. 2 show that the first jitter reducing filter 100A and the second jitter reducing filter 100B may be configured similarly to the clock jitter filter 100 of FIG. 1. The first jitter reducing filter 100A and the second jitter reducing filter 100B may perform the same as the clock jitter filter 100, or one or more of the first jitter reducing filter 100A or the second jitter reducing filter may behave differently than the clock jitter filter 100 in one or more ways.

The first jitter reducing filter 100A may include a first intermediate input clock signal node 122A, a first intermediate output clock signal node 124A, a first clock delay circuit 120A, and a first connection 126A. The first connection 126A may include an impedance element 128A, such as may be controlled by a DAC 142A based upon a signal from a PVT sensor 140A.

The second jitter reducing filter 100B may include a second intermediate input clock signal node 122B, a second intermediate output clock signal node 124B, a second clock delay circuit 120B, and a second connection 126B. The second connection 126B may include an impedance element 128B, such as may be controlled by a DAC 142B based upon a signal from a PVT sensor 140B.

As shown in FIG. 2, the second jitter reducing filter 100B may be interleaved with the first jitter reducing filter 100A such that the second intermediate input clock signal node 122B is derived from within the first clock delay circuit 120A between the first intermediate input clock signal node 122A and the first intermediate output clock signal node 124A. This may result in a portion of the first clock delay circuit 120A being shared with the second clock delay circuit 120B. In the example of FIG. 2, two of the inverting buffers 112 may be common to both the first clock delay circuit 120A and the second clock delay circuit 120B.

In an example, the first jitter reducing filter 100A and the second jitter reducing filter 100B may be in a cascaded arrangement, such as may include the second intermediate input clock signal node 122B being derived from a portion of the clock signal chain that is downstream from the first jitter reducing filter 100A. For example, the second intermediate input clock signal node 122B and the first intermediate output clock signal node 124A may be included on the same node. In an example, the second intermediate input clock signal node 122B may be downstream from the first intermediate output clock signal node 124A, such as may include being separated by one or more circuit elements, such as may include inverting buffers 112.

In an example, there may be one or more additional jitter reducing filters, such as may include N additional jitter reducing filters. Each i-th one of the N additional jitter reducing filters, where i is an integer index from 1 to N may include a (2+i)th intermediate input clock signal node, a (2+i)th intermediate output clock signal node, a (2+i)th clock delay circuit, and a (2+i)th connection. The (2+i)th connection may include an impedance element, such as may be controlled by a DAC based upon a signal from a PVT sensor.

In an example, one or more of the N additional jitter reducing filters may be interleaved with one or more of the first jitter reducing filter 100A, the second jitter reducing filter 100B, or each other. In an example, 3 or more jitter reducing filters may be interleaved such that the intermediate input node for two or more jitter reducing filters is derived from within a clock delay circuit of a first jitter reducing filter. In an example, all of the jitter reducing filters may be in a cascaded arrangement. In an example, the system may include a mix of interleaved and cascaded arrangements. Increasing the number of jitter reducing filters may help to decrease a level of clock jitter on the output clock signal node 104.

In an example, the PVT sensor 140A and the PVT sensor 140B may be partially or completely combined. For example, there may be a single PVT sensor that feeds both the DAC 142A and the DAC 142B. In an example, the DAC 142A and the DAC 142B may be partially or completely combined. For example, there may be a single DAC that feeds both the impedance element 128A and the impedance element 128B. In an example, the N additional jitter reducing filters may share one or more of the PVT sensor or DAC between themselves and the first jitter reducing filter 100A and second jitter reducing filter 100B.

Figure 3:
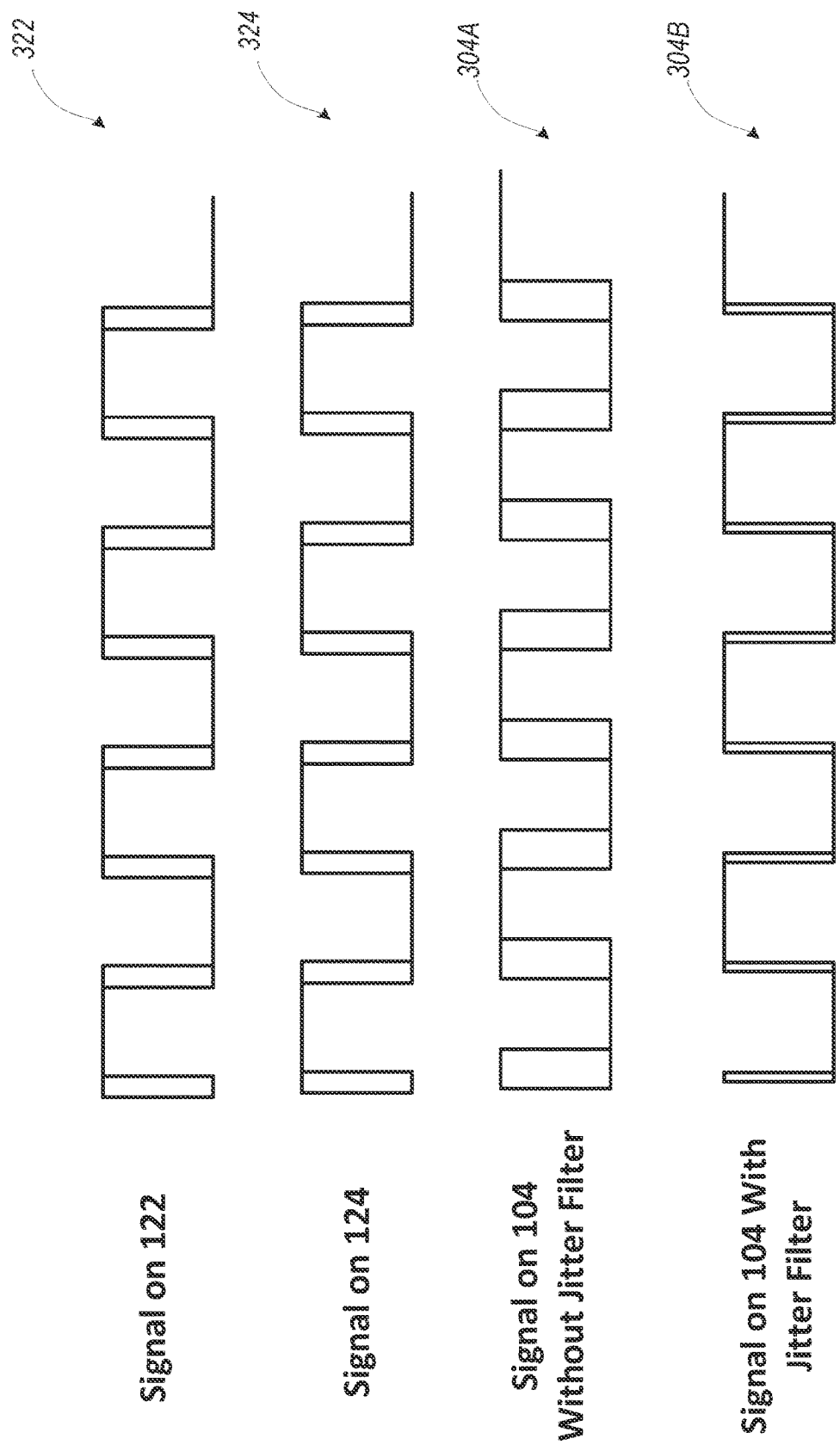
FIG. 3 is a timing diagram showing an example of operating portions of the jitter filter of FIG. 1.

FIG. 3 is a timing diagram showing an example of operating portions of the jitter filter of FIG. 1. FIG. 3 shows the signal 322 on first intermediate input clock signal node 122, the signal 324 on the first intermediate output clock signal node 124, the signal 304A that would exist on the output clock signal node 104 if the circuit did not include the clock jitter filter 100, and the signal 304B on the output clock signal node 104 that exists with the clock jitter filter 100 in the circuit. Each of the signals shown in FIG. 3 include a box on the rising and falling edge showing an uncertainty in the position of the rising and falling edge, such as may be indicative of clock jitter. The exact position of the rising and falling edges may vary within the box from one clock cycle to the next.

At a given point in time, the signal 324 on the first intermediate output clock signal node 124 may be similar to the signal 322 on the first intermediate input clock signal node 122 because it is delayed by an odd integer multiple of one-half period and inverted. However, at any given point in time, the specific cycle of the signal 324 does not correspond to the same cycle as the signal 322, such as may be due to the first clock delay circuit 120. For example, the signal 322 may carry a clock signal that is one-half period behind the signal 324 because the signal 324 has been delayed by a half period by the first clock delay circuit 120. Because the signal 324 is from a different cycle than the signal 322, the random jitter in the edges of signal 322 may be different than signal 324, which may result in the edges being at different times. The first connection 126 may provide one or more of a feed forward path or feedback path, such as may allow the signal 322 and the signal 324 to average together one or more of rising or falling edges. This averaging may result in reduced clock jitter shown in signal 304B as compared to a system without a clock jitter filter 100 as shown in signal 304A.

Figure 4:
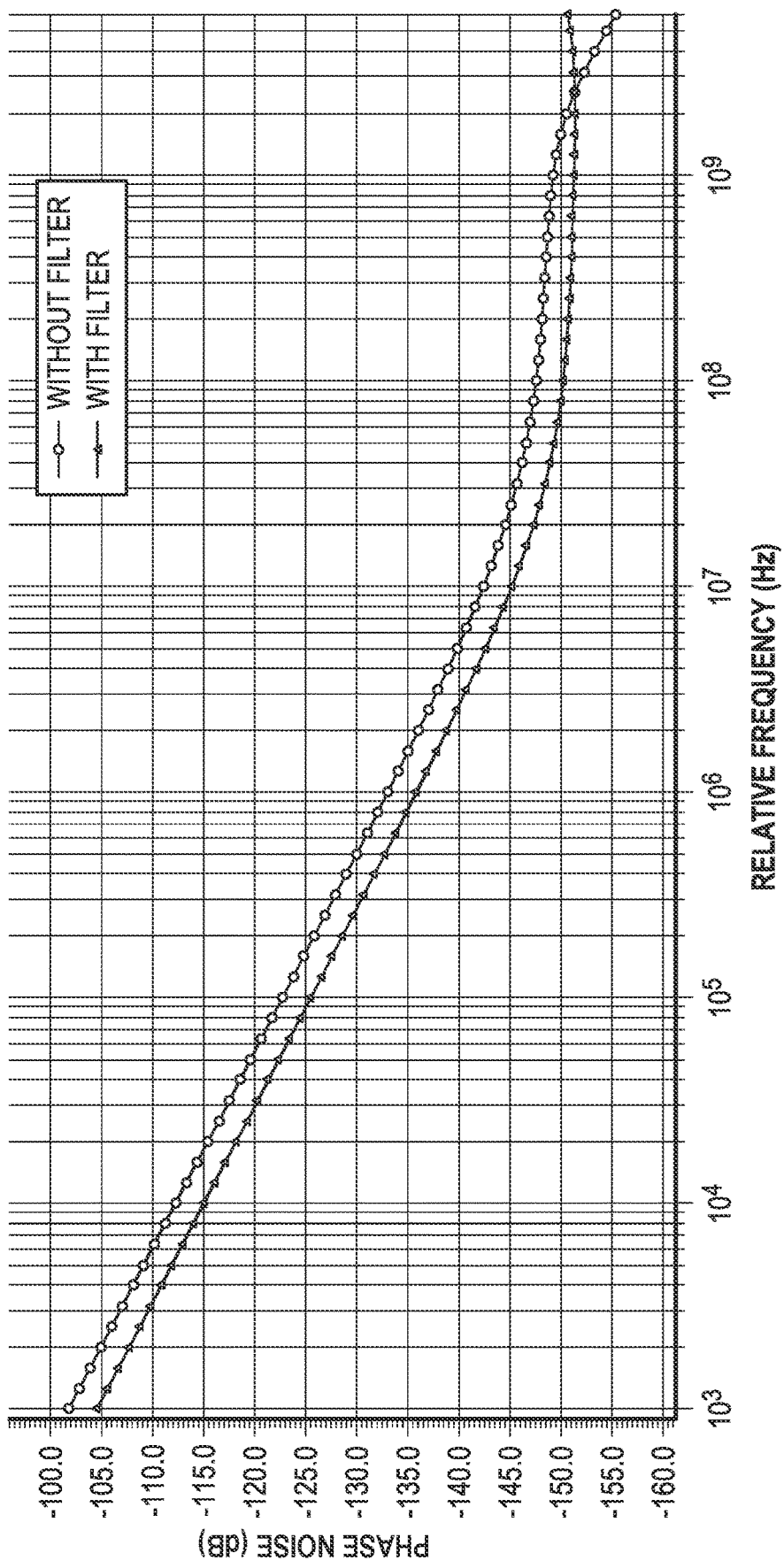
FIG. 4 is a plot of simulated data showing the phase noise of a circuit with and without a clock jitter filter across a range of frequencies.

FIG. 4 is a plot of simulated data showing the phase noise of a circuit with and without a clock jitter filter 100 across a range of frequencies. FIG. 4. Shows that the jitter reducing configuration of FIG. 2 may result in an approximately 3 dB decrease in phase noise across a range of frequencies as compared to a circuit without jitter reducing circuitry. This 3 dB decrease in phase noise corresponds to a reduction in clock jitter that may help allow for one or more of faster circuits or more efficient circuits.

Figure 5:
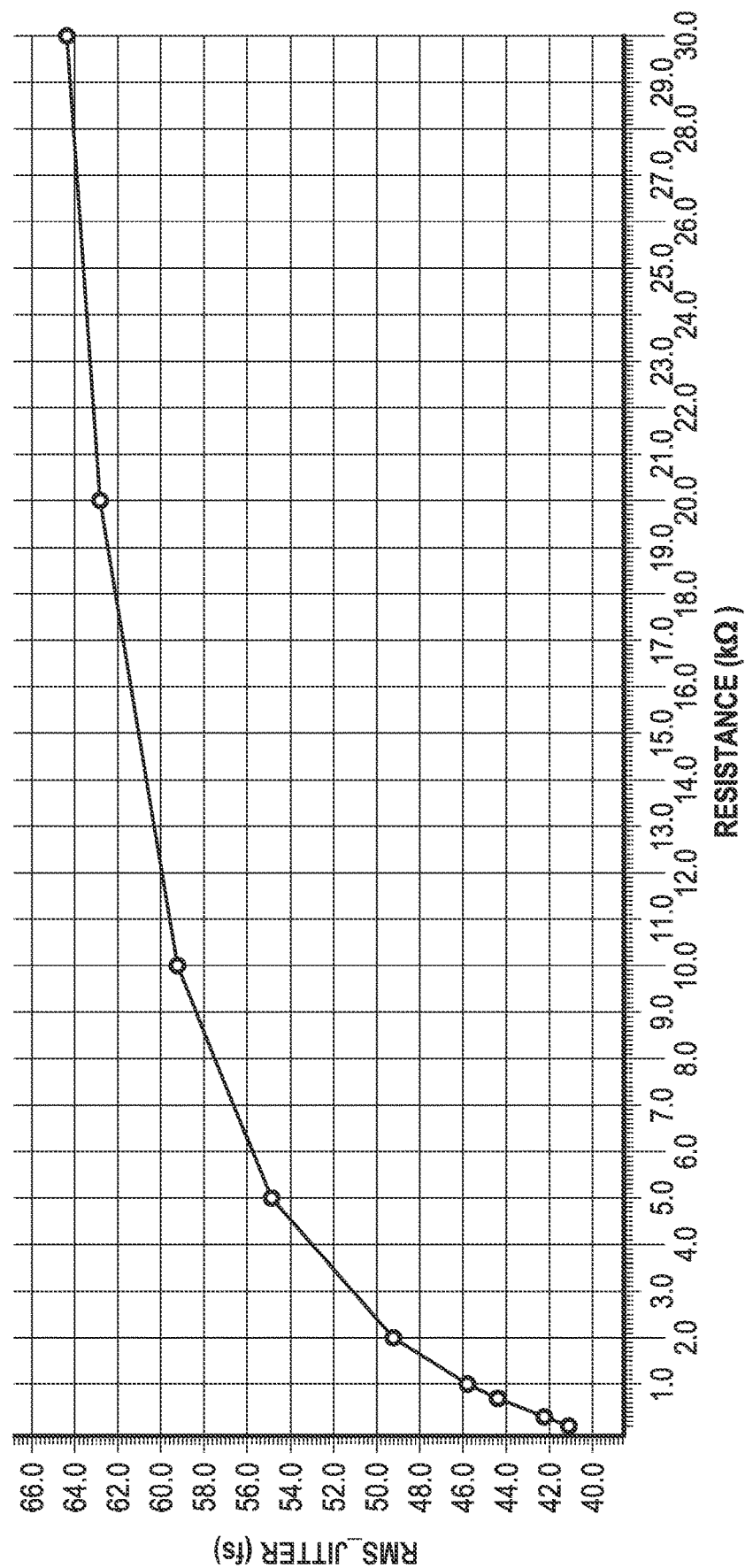
FIG. 5 is a plot of simulated data showing the jitter of a clock signal with various feedback resistances in the clock jitter filter.

FIG. 5 is a plot of simulated data showing the jitter of a clock signal with various feedback resistances in the clock jitter filter 100. FIG. 5 shows that the root mean square (RMS) jitter value decreases as the resistance of the impedance element 128 decreases. However, decreased resistance of the impedance element 128 may result in one or more undesirable effects, such as may include one or more of increased power dissipation or increased voltage drop. Using the chart of FIG. 5, a resistance value that helps achieve a desired clock jitter and one or more other factors associated with resistance may be selected. For example, an RMS clock jitter below 55 femtoseconds may be desired, which may result in selecting a resistance value below 5.0 kiloohms.

Increasing the resistance value of the impedance element 128 towards a very large value, such as an infinite resistance, may result in a system that behaves similarly to a system without a first connection 126. Decreasing the resistance value of the impedance element 128 towards a very small value, such as zero resistance, may continue to minimize clock jitter. In some examples, decreasing the resistance value of the impedance element 128 below a specified impedance may cause an undesirable effect, such as may include one or more of a circuit instability, an increase in power consumption, or other unwanted behavior.

Figure 6:
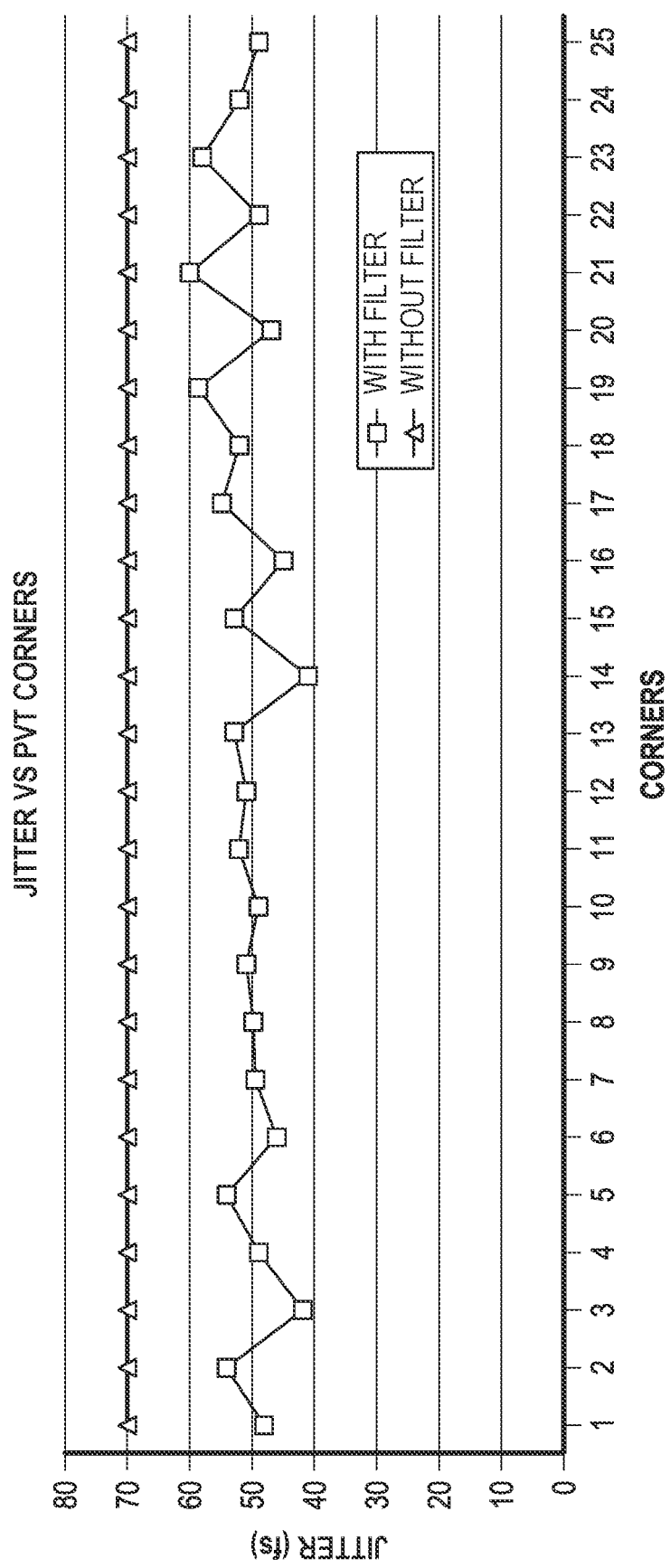
FIG. 6 is a plot of simulated data showing the jitter of a clock signal at various process corners with and without a clock jitter filter.

FIG. 6 is a plot of simulated data showing the jitter of a clock signal at various process corners with and without a clock jitter filter. FIG. 6 shows that a system may include a number of PVT corners, such as may include various permutations of one or more of process variations, temperature variations, and voltage variations. The PVT corners may be randomly selected to simulate a set of completed devices, or the PVT corners may be selected to achieve one or more worst case scenario variations. The worst case scenario variations may be one or more of determined experimentally or determined through simulation. FIG. 6 shows that the jitter may be relatively constant at various PVT corners without a filter. The jitter may be lower at all corners with a filter. However, there may be more variation in the jitter between one or more of the corners when using a filter. This may be due to one or more of various PVT corners affecting the ability of the clock jitter filter 100 to reduce jitter as compared to other PVT corners.

Figure 7:
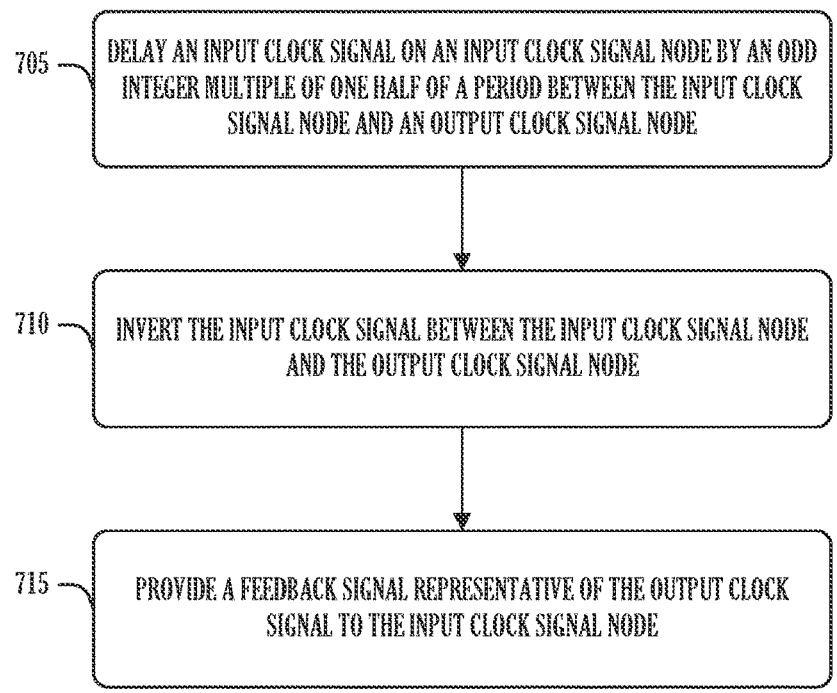
FIG. 7 is a diagram showing an example of a method for operating portions of a clock jitter filter.

FIG. 7 is a diagram 700 showing an example of a method for operating portions of a clock jitter filter, such as may include a method for managing clock jitter. At 705—an input clock signal on an input clock signal node can be delayed by an odd integer multiple of one half of a period between the input clock signal node and an output clock signal node. At 710—the input clock signal can be inverted between the input clock signal node and the output clock signal node. At 715—feedback signal representative of the output clock signal can be provided to the input clock signal node. The shown order of steps is not intended to be a limitation on the order the steps are performed in. In an example, two or more steps may be performed simultaneously or at least partially concurrently. For example, step 705 and step 710 may be performed simultaneously using at least partially the same circuitry.

The input clock signal may be delayed at 705 using a delay circuit, such as may include the first clock delay circuit 120. For example, the clock signal may be delayed using one or more circuit elements in one or more of a cascaded or parallel arrangement. In an example, delaying the clock signal at 705 may include one or more of tuning or adjusting a time value of the delay. For example, a delay time of the first clock delay circuit 120 may be adjusted to match a change in operating frequency of the clock generator 110. In an example, a delay time of the first clock delay circuit 120 may be adjusted to account for a process variation, voltage variation, or temperature variation. This may include a variation in the manufacturing of the clock jitter filter 100 or surrounding system. The clock jitter filter 100 may be connected to one or more other systems, such as may monitor operation and tune the delay of the first clock delay circuit 120.

In an example, the method shown in diagram 700 may include an additional step of providing a feed forward signal representative of the input clock signal to the output clock signal node. This signal may be provided simultaneously to the signal in step 715. For example, the first connection 126 may provide a feed forward and feedback signal simultaneously using the same electrical connection. In an example, a feed forward signal may be provided alternatively to the signal provided in step 715.

Figure 8:
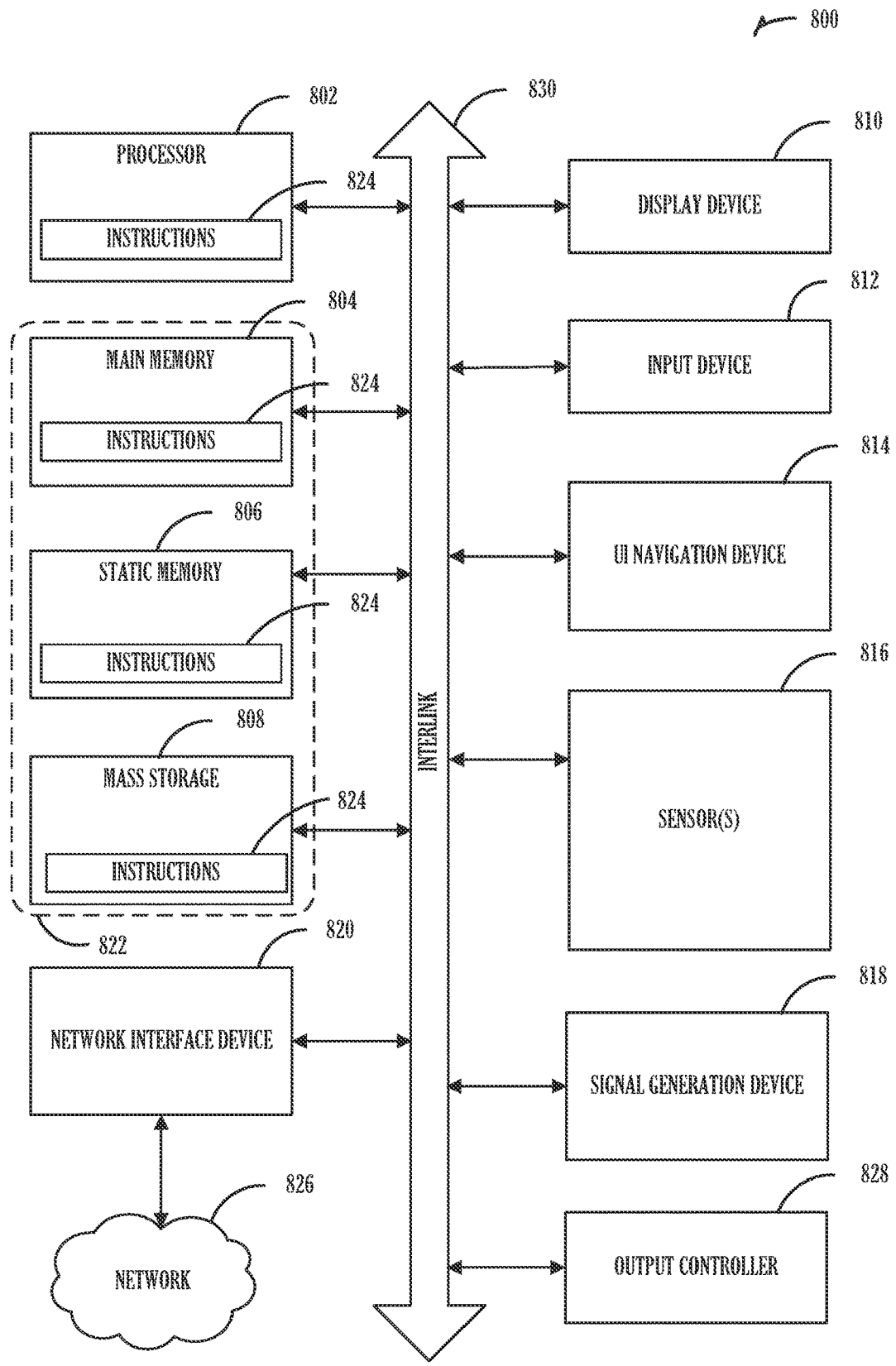
FIG. 8 is a block diagram of an example of portions of a machine upon which one or more portions of the present disclosure may be implemented.

FIG. 8 is a block diagram of an example of portions of a machine 800 upon which one or more portions of the present disclosure may be implemented. Examples, as described herein, may include, or may operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 800 follow.

In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 800 may include a hardware processor 802 (e.g., a central processing unit (CPU), a graphics processing unit (GPU), a hardware processor core, or any combination thereof), a main memory 804, a static memory (e.g., memory or storage for firmware, microcode, a basic-input-output (BIOS), unified extensible firmware interface (UEFI), etc.) 806, and mass storage 808 (e.g., hard drives, tape drives, flash storage, or other block devices) some or all of which may communicate with each other via an interlink (e.g., bus) 830. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 808, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 802, the main memory 804, the static memory 806, or the mass storage 808 may be, or include, a machine readable medium 822 on which is stored one or more sets of data structures or instructions 824 (e.g., software) embodying or utilized by any one or more of the techniques or functions described herein. The instructions 824 may also reside, completely or at least partially, within any of registers of the processor 802, the main memory 804, the static memory 806, or the mass storage 808 during execution thereof by the machine 800. In an example, one or any combination of the hardware processor 802, the main memory 804, the static memory 806, or the mass storage 808 may constitute the machine readable media 822. While the machine readable medium 822 is illustrated as a single medium, the term "machine readable medium" may include a single medium or multiple media (e.g., a centralized or distributed database, and/or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 822 may be representative of the instructions 824, such as instructions 824 themselves or a format from which the instructions 824 may be derived. This format from which the instructions 824 may be derived may include source code, encoded instructions (e.g., in compressed or encrypted form), packaged instructions (e.g., split into multiple packages), or the like. The information representative of the instructions 824 in the machine readable medium 822 may be processed by processing circuitry into the instructions to implement any of the operations discussed herein. For example, deriving the instructions 824 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 may include assembly, compilation, or interpretation of the information (e.g., by the processing circuitry) to create the instructions 824 from some intermediate or preprocessed format provided by the machine readable medium 822. The information, when provided in multiple parts, may be combined, unpacked, and modified to create the instructions 824. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 may be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards). Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

Additional Notes & Examples

Example 1 is a system for reducing clock jitter, the system comprising: first jitter reducing circuitry, the first jitter reducing circuitry arranged between an input clock signal node carrying an input clock signal and an output clock signal node carrying an output clock signal, the first jitter reducing circuitry including a first intermediate input clock signal node and a first intermediate output clock signal node, the first jitter reducing circuitry comprising: a first clock delay circuit, configured to: (1) delay a first intermediate input clock signal received on the first intermediate input clock signal node by an odd integer multiple of one half of a period, and (2) invert the first intermediate input clock signal; and a first connection, from the first intermediate output clock signal node to the first intermediate input clock signal node.

In Example 2, the subject matter of Example 1 optionally includes second jitter reducing circuitry, the second jitter reducing circuitry arranged between the input clock signal node and the output clock signal node, the second jitter reducing circuitry including a second intermediate input clock signal node and a second intermediate output clock signal node, the second jitter reducing circuitry comprising: a second clock delay circuit, configured to: (1) delay a second intermediate input clock signal received on the second intermediate input clock signal node by an odd integer multiple of one half of a period, and (2) invert the second intermediate input clock signal; and a second connection, from the second intermediate output clock signal node to the second intermediate input clock signal node.

In Example 3, the subject matter of Example 2 optionally includes wherein the first jitter reducing circuitry and the second jitter reducing circuitry are in a cascaded arrangement such that the second intermediate input clock signal node is connected to the first intermediate output clock signal node.

In Example 4, the subject matter of any one or more of Examples 2-3 optionally include wherein the first jitter reducing circuitry and the second jitter reducing circuitry are interleaved such that the second intermediate input clock signal is derived from within the first clock delay circuit between the first intermediate input clock signal node and the first intermediate output clock signal node.

In Example 5, the subject matter of Example 4 optionally includes wherein a portion of the first clock delay circuit comprises a portion of the second clock delay circuit.

In Example 6, the subject matter of any one or more of Examples 2-5 optionally include N additional jitter reducing circuits, the N additional jitter reducing circuits arranged between the input clock signal node and the output clock signal node, each i-th one of the N additional jitter reducing circuits, where i is an integer index from 1 to N including a (2+i)th intermediate input clock signal node and a (2+i)th intermediate output clock signal node, each of the N additional jitter reducing circuits comprising: a (2+i)th clock delay circuit, configured to: (1) delay the (2+i)th intermediate input clock signal received on the (2+i)th intermediate input clock signal node by one half of a period, and (2) invert the (2+i)th intermediate input clock signal; and a (2+i)th connection, from the (2+i)th intermediate output clock signal node to the (2+i)th intermediate input clock signal node.

In Example 7, the subject matter of any one or more of Examples 1-6 optionally include wherein the first connection provides a first specified impedance value, wherein the first specified impedance value includes an impedance provided by a passive circuit element with an impedance.

In Example 8, the subject matter of any one or more of Examples 1-7 optionally include wherein the first connection provides a first specified impedance value, wherein the first specified impedance value includes an impedance provided by a passive circuit element with an impedance.

In Example 9, the subject matter of any one or more of Examples 1-8 optionally include wherein the first connection provides a first specified impedance value, wherein the first specified impedance value includes an impedance provided by a transmission gate.

In Example 10, the subject matter of Example 9 optionally includes wherein the transmission gate is controlled to generate the first specified impedance value.

In Example 11, the subject matter of Example 10 optionally includes wherein the first specified impedance value is adjusted to compensate for at least one of a process variation, a voltage variation, or a temperature variation.

In Example 12, the subject matter of Example 11 optionally includes wherein the transmission gate is controlled by an analog voltage signal generated by a digital-to-analog converter to compensate for at least one of the process variation, the voltage variation, or the temperature variation.

In Example 13, the subject matter of any one or more of Examples 1-12 optionally include wherein the first clock delay circuit is configured to delay the first intermediate input clock signal received on the first intermediate input clock signal node by one half of a period.

In Example 14, the subject matter of any one or more of Examples 1-13 optionally include wherein the first clock delay circuit includes an odd number of inverting buffers in a cascaded arrangement.

In Example 15, the subject matter of Example 14 optionally includes wherein the first clock delay circuit includes three inverting buffers in a cascaded arrangement.

In Example 16, the subject matter of any one or more of Examples 1-15 optionally include a voltage controlled LC oscillator configured to provide the input clock signal.

In Example 17, the subject matter of any one or more of Examples 1-16 optionally include a voltage controlled ring oscillator configured to provide the input clock signal.

Example 18 is a method for managing clock jitter, the method comprising: delaying an input clock signal on an input clock signal node by an odd integer multiple of one half of a period between the input clock signal node and an output clock signal node; inverting the input clock signal between the input clock signal node and the output clock signal node; and providing a signal representative of the output clock signal to the input clock signal node.

In Example 19, the subject matter of Example 18 optionally includes wherein the delaying an input clock signal includes: at least one of tuning or adjusting a time value of the delay.

Example 20 is a system for reducing clock jitter, the system comprising: first jitter reducing circuitry, the first jitter reducing circuitry arranged between an input clock signal node carrying an input clock signal and an output clock signal node carrying an output clock signal, the first jitter reducing circuitry including a first intermediate input clock signal node and a first intermediate output clock signal node, the first jitter reducing circuitry comprising: a first clock delay circuit, comprising: means to delay a first intermediate input clock signal received on the first intermediate input clock signal node by an odd integer multiple of one half of a period, and means to invert the first intermediate input clock signal; and a first connection, comprising means to provide a signal from the first intermediate output clock signal node to the first intermediate input clock signal node.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first." "second." and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system for reducing clock jitter, the system comprising:
    first jitter reducing circuitry, the first jitter reducing circuitry arranged between an input clock signal node carrying an input clock signal and an output clock signal node carrying an output clock signal, the first jitter reducing circuitry including a first intermediate input clock signal node and a first intermediate output clock signal node, the first jitter reducing circuitry comprising:
        a first clock delay circuit, configured to: (1) delay a first intermediate input clock signal received on the first intermediate input clock signal node by an odd integer multiple of one half of a period of the first intermediate input clock signal, and (2) invert the first intermediate input clock signal; and
        a first connection, from the first intermediate output clock signal node to the first intermediate input clock signal node.

2. The system of claim 1, further comprising:
    second jitter reducing circuitry, the second jitter reducing circuitry arranged between the input clock signal node and the output clock signal node, the second jitter reducing circuitry including a second intermediate input clock signal node and a second intermediate output clock signal node, the second jitter reducing circuitry comprising:
        a second clock delay circuit, configured to: (1) delay a second intermediate input clock signal received on the second intermediate input clock signal node by an odd integer multiple of one half of a period, and (2) invert the second intermediate input clock signal; and
        a second connection, from the second intermediate output clock signal node to the second intermediate input clock signal node.

3. The system of claim 2, wherein the first jitter reducing circuitry and the second jitter reducing circuitry are in a cascaded arrangement such that the second intermediate input clock signal node is connected to the first intermediate output clock signal node.

4. The system of claim 2, wherein the first jitter reducing circuitry and the second jitter reducing circuitry are interleaved such that the second intermediate input clock signal is derived from within the first clock delay circuit between the first intermediate input clock signal node and the first intermediate output clock signal node.

5. The system of claim 4, wherein a portion of the first clock delay circuit comprises a portion of the second clock delay circuit.

6. The system of claim 2, further comprising:
    N additional jitter reducing circuits, the N additional jitter reducing circuits arranged between the input clock signal node and the output clock signal node, each i-th one of the N additional jitter reducing circuits, where i is an integer index from 1 to N including a (2+i)th intermediate input clock signal node and a (2+i)th intermediate output clock signal node, each of the N additional jitter reducing circuits comprising:
        a (2+i)th clock delay circuit, configured to: (1) delay the (2+i)th intermediate input clock signal received on the (2+i)th intermediate input clock signal node by one half of a period, and (2) invert the (2+i)th intermediate input clock signal; and a (2+i)th connection, from the (2+i)th intermediate output clock signal node to the (2+i)th intermediate input clock signal node.

7. The system of claim 1, wherein the first connection provides a first specified impedance value, wherein the first specified impedance value includes an impedance provided by a passive circuit element with an impedance.

8. The system of claim 1, wherein the first connection provides a first specified impedance value, wherein the first specified impedance value includes an impedance provided by a passive circuit element with an impedance.

9. The system of claim 1, wherein the first connection provides a first specified impedance value, wherein the first specified impedance value includes an impedance provided by a transmission gate.

10. The system of claim 9, wherein the transmission gate is controlled to generate the first specified impedance value.

11. The system of claim 10, wherein the first specified impedance value is adjusted to compensate for at least one of a process variation, a voltage variation, or a temperature variation.

12. The system of claim 11, wherein the transmission gate is controlled by an analog voltage signal generated by a digital-to-analog converter to compensate for at least one of the process variation, the voltage variation, or the temperature variation.

13. The system of claim 1, wherein the first clock delay circuit is configured to delay the first intermediate input clock signal received on the first intermediate input clock signal node by one half of a period.

14. The system of claim 1, wherein the first clock delay circuit includes an odd number of inverting buffers in a cascaded arrangement.

15. The system of claim 14, wherein the first clock delay circuit includes three inverting buffers in a cascaded arrangement.

16. The system of claim 1, further comprising a voltage controlled LC oscillator configured to provide the input clock signal.

17. The system of claim 1, further comprising a voltage controlled ring oscillator configured to provide the input clock signal.

18. A method for managing clock jitter, the method comprising:
   delaying an input clock signal on an input clock signal node by an odd integer multiple of one half of a period of the input clock signal between the input clock signal node and an output clock signal node;
   inverting the input clock signal between the input clock signal node and the output clock signal node; and
   providing a signal representative of the output clock signal to the input clock signal node.

19. The method of claim 18, wherein the delaying an input clock signal includes:
   at least one of tuning or adjusting a time value of the delay.

20. A system for reducing clock jitter, the system comprising:
   first jitter reducing circuitry, the first jitter reducing circuitry arranged between an input clock signal node carrying an input clock signal and an output clock signal node carrying an output clock signal, the first jitter reducing circuitry including a first intermediate input clock signal node and a first intermediate output clock signal node, the first jitter reducing circuitry comprising:
   a first clock delay circuit, comprising:
      means to delay a first intermediate input clock signal received on the first intermediate input clock signal node by an odd integer multiple of one half of a period of the first intermediate input clock signal, and
      means to invert the first intermediate input clock signal; and
   means to provide a signal from the first intermediate output clock signal node to the first intermediate input clock signal node.

* * * * *